United States Patent [19]

Fujiki et al.

[11] Patent Number: 4,571,561
[45] Date of Patent: Feb. 18, 1986

[54] NOISE REDUCTION FILTER

[75] Inventors: Yasuo Fujiki; Toshio Hori, both of Takefu, Japan

[73] Assignee: Murata Manufacturing Co., Ltd., Japan

[21] Appl. No.: 645,310

[22] Filed: Aug. 29, 1984

[30] Foreign Application Priority Data

Sep. 5, 1983 [JP] Japan ............... 58-138656[U]

[51] Int. Cl.⁴ ............................................. H03H 7/01
[52] U.S. Cl. ................................. 333/184; 333/167; 333/185
[58] Field of Search ............. 333/167, 175–185, 333/12

[56] References Cited

U.S. PATENT DOCUMENTS 3,593,217 7/1971 Weber ........................ 333/175
4,516,092 5/1985 Rosenberg ..................... 333/185

FOREIGN PATENT DOCUMENTS 818775 8/1959 United Kingdom ............... 333/181

Primary Examiner—Marvin L. Nussbaum
Attorney, Agent, or Firm—Ostrolenk, Faber, Gerb & Soffen

[57] ABSTRACT

A noise reduction filter which comprises a block of magnetizable material, and first and second laminated capacitors each having first and second terminal electrodes opposite to each other. The first and second capacitors are mounted on one surface of the block with the second terminal electrodes of the respective first and second capacitors spacedly confronting with each other. The filter also comprises a first electrode member partially extending through the block with its opposite end portions connected to the first terminal electrodes of the respective first and second capacitors, and a second electrode member mounted on the block with a portion thereof electrically connecting the second terminal electrodes of the respective first and second capacitors together.

5 Claims, 18 Drawing Figures

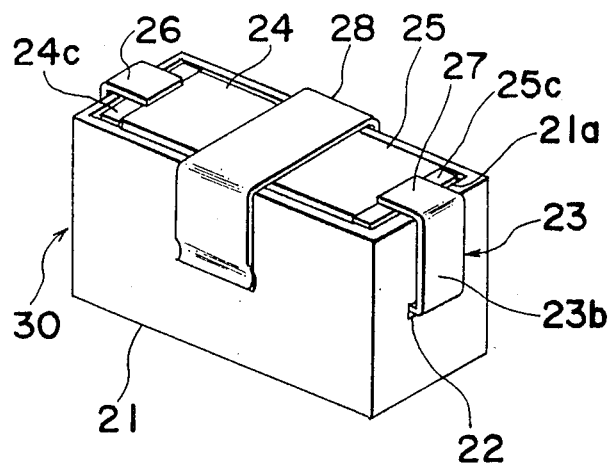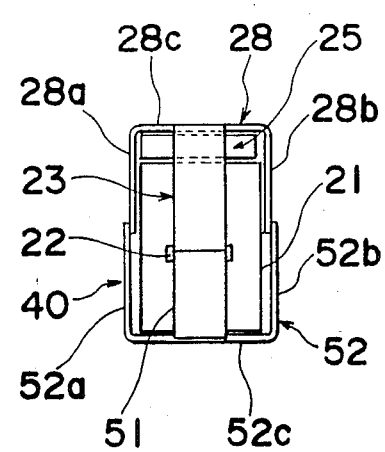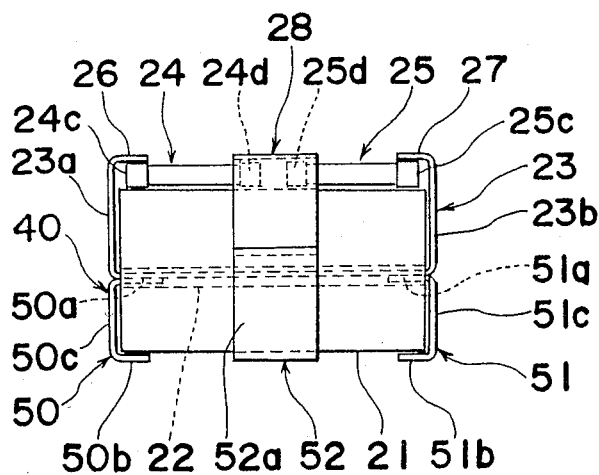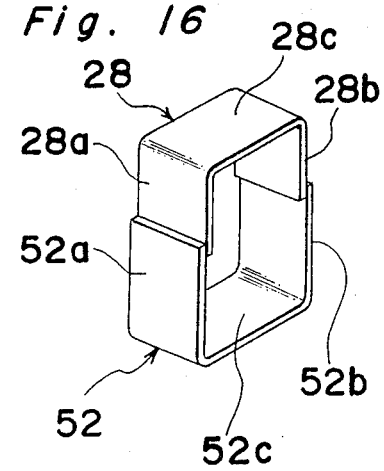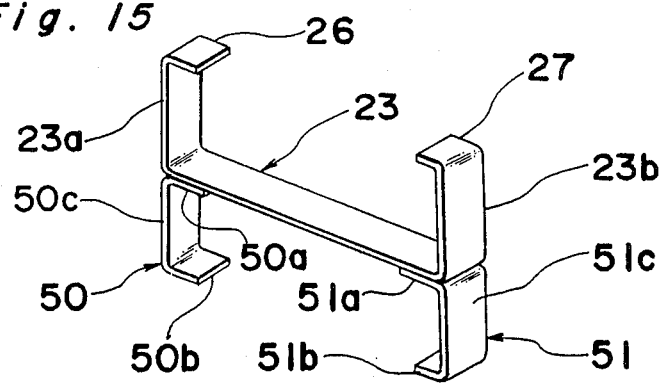

NOISE REDUCTION FILTER

BACKGROUND OF THE INVENTION

The present invention relates to a noise reduction filter for use in electronic equipment for substantially reducing noises.

It has long been a usual practice to use a combined system of inductance and capacitance elements as a noise reduction filter, an example of which is shown in FIG. 1 of the accompanying drawings.

The prior art noise reduction filter shown by 1 in FIG. 1 comprises a metallic casing 2 accommodating therein a filter assembly including a pair of feed-through capacitors 4 and 5 spaced by and positioned on respective sides of a cylindrical magnetizable body 3 of, for example, ferrite, and a lead terminal member 6 extending completely through the filter assembly with its opposite ends situated exteriorly of the casing 2. The filter assembly together with the lead terminal 6 is confined within the casing 2 by means of a sealing resin 7 closing the opposite ends of the casing 2. In this construction, when an electric current flows through the lead terminal member 6, an electric field is developed in the magnetized body 3, thereby providing an impedance in a manner similar to a coil. An equivalent circuit of the noise reduction filter shown in FIG. 1 is illustrated in FIG. 2.

Another example of a prior art noise reduction filter is shown by 10 in FIG. 3. The noise reduction filter 10 comprises a casing 11 made of synthetic resin and having a cylindrical magnetizable body 12 of, for example, ferrite embedded therein, and a generally U-shaped lead terminal member 13 having one of its opposite arm portions extending through the casing 11 and then through a through-hole capacitor 15 and the other of the opposite arm portions extending through the magnetizable body 12 and then through a feed-through capacitor 14, the feed-through capacitors 14 and 15 being mounted on a chassis 16 and soldered respectively to the opposite arm portions of the lead terminal member 13. An equivalent circuit of the noise reduction filter 10 is similar to that shown in FIG. 2.

Both of the prior art filters 1 and 10 shown respectively in FIGS. 1 and 3 require the use of an increased number of the component parts and are, therefore, complicated and time-consuming to fabricate. Because of this, the prior art noise reduction filters discussed above are relatively expensive to manufacture.

SUMMARY OF THE INVENTION

The present invention has been developed with a view to substantially eliminating the above described disadvantages inherent in the prior art noise reduction filters and has for its essential object to provide an improved noise reduction filter which can be fabricated with the minimized number of component parts in a compact size and which can exhibit an excellent performance.

Another object of the present invention is to provide an improved noise reduction filter of the type referred to above, which is easy to fabricate and requires no substantial complicated and time-consuming procedures.

BRIEF DESCRIPTION OF THE DRAWINGS

These and other objects and features of the present invention will become readily understood from the following description taken in conjunction with preferred embodiments thereof with reference to the accompanying drawings, in which:

FIG. 12 is a perspective view of the filter shown in FIG. 10;

FIG. 13 is a side view of the filter according to a further preferred embodiment of the present invention;

FIG. 14 is an end view of the filter shown in FIG. 13;

FIGS. 15 and 16 are perspective views showing respective plate electrodes used in the filter shown in FIG. 13;

DETAILED DESCRIPTION OF THE EMBODIMENTS

Figure 1:
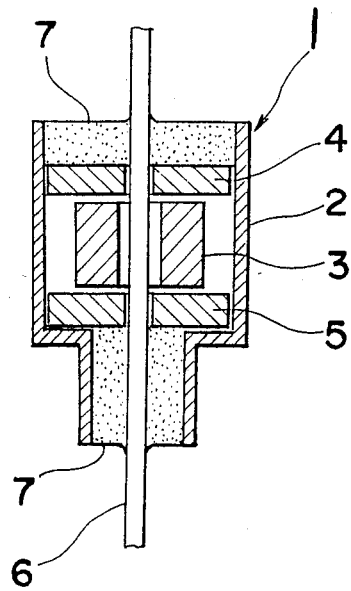
FIGS. 1 and 3 are sectional views of the prior art noise reduction filters, respectively.
Figure 3:
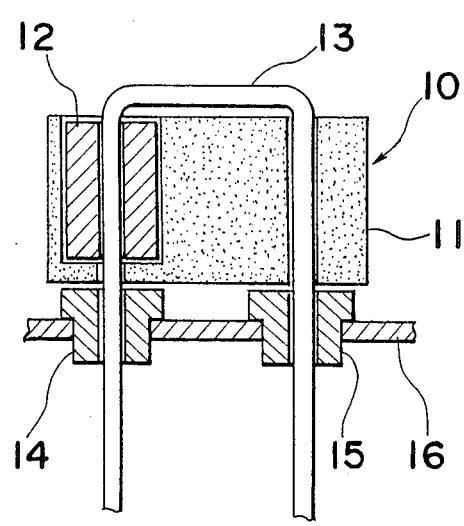
Figure 2:
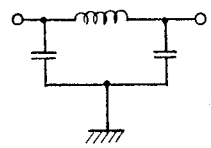
FIG. 2 is a diagram showing an equivalent circuit of any one of the filters shown in FIGS. 1 and 3.
Figure 4:
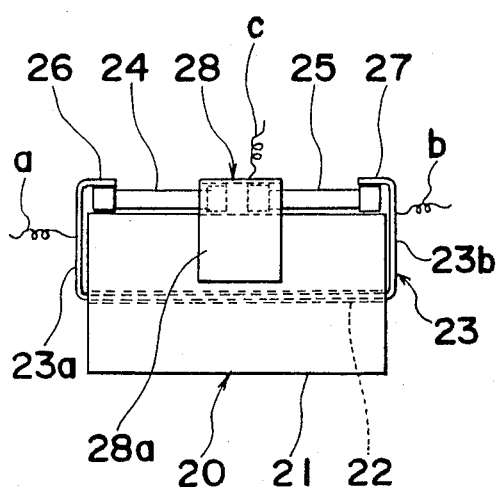
FIG. 4 is a side view of a noise reduction filter according to a preferred embodiment of the present invention.

Before the description of the present invention proceeds, it is to be noted that like parts are designated by like reference numerals through the accompanying drawings except for FIGS. 1 to 3.

Figure 5:
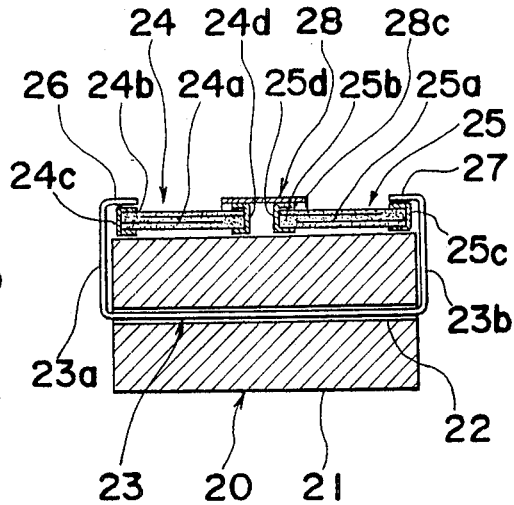
FIG. 5 is a side sectional view of the filter shown in FIG. 4.
Figure 6:
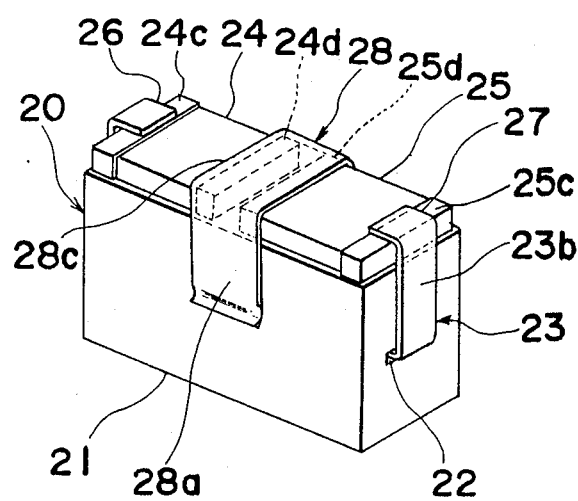
FIG. 6 is a perspective view of the filter shown in FIG. 4.
Figure 7:
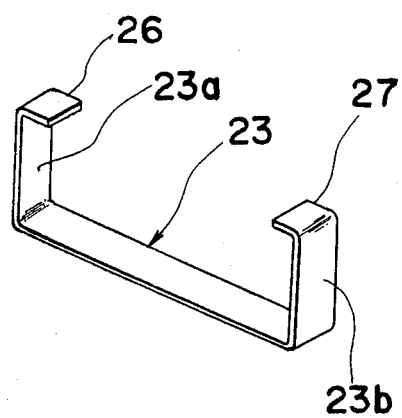
FIGS. 7 and 8 are perspective views showing respective plate electrodes used in the filter shown in FIG. 4.
Figure 8:
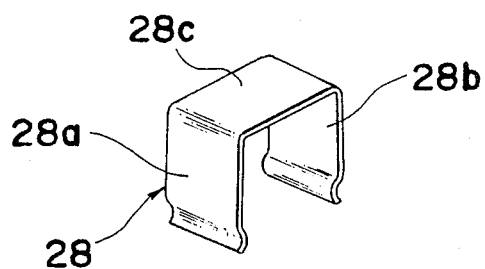

Referring first to FIGS. 4 to 9, a noise reduction filter 20 according to the embodiment shown therein comprises a block 21 of generally rectangular cube-like shape made of a magnetizable material such as, for example, ferrite. The block 21 has a generally flattened through-hole 22 defined therein so as to extend completely through the longitudinal sense of the body 21 for the passage of a first strip electrode 23 therethrough. Paired capacitors 24 and 25 are mounted on an upper surface of the block 21 in spaced relation to each other. Each of the paired capacitors 24 and 25 is in the form of, for example, a laminated capacitor comprising a respective dielectric body 24b or 25b having internal electrodes 24a or 25a embedded therein and also having a respective pair of terminal electrodes 24c and 24d, or 25c and 25d formed on the opposite ends thereof in electrically connected relation to the internal electrodes 24a or 25a, as best shown in FIG. 5.

The first strip electrode 23 having its generally intermediate portion extending through the through-hole 22 in the block 21 has its opposite end portions 23a and 23b situated exteriorly of the block 21. These end portions 23a and 23b of the first strip electrode 23 are bent at right angles so as to extend upwardly, as viewed in FIGS. 4 and 5, along the opposite end faces of the block 21, and then electrically connected by soldering or any suitable means to the terminal electrodes 24c and 25c of the associated capacitors 24 and 25, respectively, after having been again bent inwardly as at 26 and 27 so as to extend in a direction close towards each other while overlaying the terminal electrodes 24c and 25c. At the same time, the bent ends 26 and 27 of the first strip electrode 23 soldered to the respective terminal electrodes 24c and 25c serve to press the terminal electrodes 24c and 25c towards the block 21 to keep them in tight contact with the upper surface of the block 21.

Mounted on the block 21 so as to overlay the terminal electrodes 24d and 25d of the respective capacitors 24 and 25 is a second strip electrode 28 having a generally U-shaped configuration including a pair of legs 28a and 28b and a bridging portion 28c connecting the legs 28a and 28b together. With the second strip electrode 28 so mounted, the bridging portion 28c thereof is electrically connected by soldering or any suitable means to both of the terminal electrodes 24d and 25d of the respective capacitors 24 and 25 and, at the same time, the terminal electrodes 24d and 25d are pressed towards the upper surface of the block 21 because of the second strip electrode 28 serving concurrently as a clip.

Figure 9:
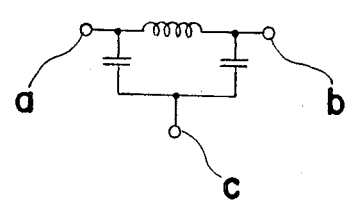
FIG. 9 is a diagram showing an equivalent circuit of the filter shown in FIG. 4.

When the noise reduction filter 20 of the construction described hereinabove with reference to FIGS. 4 to 8 is to be used, the opposite ends 26 and 27 of the first strip electrode 23 are to be electrically connected to external circuit elements through respective lead lines a and b while the second strip electrode 28 is to be grounded through a lead line c. In this circuit arrangement, it will readily be understood that, as shown in FIG. 9 showing an electric equivalent circuit of the noise reduction filter 20, a parallel circuit of the two capacitors 24 and 25 is formed between the ground, represented by the second strip electrode 28, and the terminals represented by the respective bent ends 26 and 27 of the first strip electrode 23, and, therefore, when an electric current is applied to the first strip electrode 23, a magnetic field is developed in the block 21, thereby providing an impedance to a high frequency noise. In other words, the noise reduction filter 20 operating in the manner described above is a filter of LC$\pi$ type.

In the foregoing embodiment, the capacitors 24 and 25 have been described and shown as mounted on the upper surface of the block 21. However, in the embodiment shown in FIGS. 10 to 12, the capacitors 24 and 25 are accommodated and placed in a rectangular recess 21a defined in the upper surface of the block 21, it being, however, to be noted that the depth of the recess 21a is smaller, or slightly smaller, than the thickness of each of the capacitors 24 and 25 so as to ensure the electric connection not only between the bent ends 26 and 27 and the associated terminal electrodes 24c and 25c, but also between the bridging portion 28c of the second strip electrode 28 and the terminal electrodes 24d and 25d. While the noise reduction filter of the construction shown in FIGS. 10 to 12 an.d designated by 30 functions in the same manner as in the foregoing embodiment shown in FIGS. 4 to 8, the noise reduction filter 30 can have a reduced height as compared with the noise reduction filter 20 of the foregoing embodiment because of the capacitors 24 and 25 seating within the recess 21a.

While the noise reduction filter of any one of the foregoing embodiments shown in FIGS. 4 to 8 and FIGS. 10 to 12 is satisfactory in structure, it may happen that, when the noise reduction filter is to be connected with electric circuit elements on a printed circuit board while mounted thereon with its lower surface held in contact with the surface of the printed circuit board, relatively long wirings are required to connect the opposite ends of the first strip electrode 23 to the associated circuit elements on the printed circuit board and also to connect the second strip electrode 28 to the ground. The use of the relatively long wirings referred to above may be obviated according to the embodiment shown in FIGS. 13 to 16.

Referring now to FIGS. 13 to 16, the noise reduction filter according to the embodiment shown therein is generally identified by 40 and is substantially identical with the noise reduction filter 20 shown in FIGS. 4 to 8 except that the filter 40 is additionally provided with extensions 50 and 51 and an auxiliary electrode member 52.

The extension 50 is of a geherally U-shaped configuration having a pair of opposite arms 50a and 50b connected together with a bridging portion 50c, one of said arms 50a being inserted in the through-hole 22 and secured to the first strip electrode 23 while the other of the arms 50b is engaged to the lower surface of the block 21 with the bridging portion 50c extending along the end face of the block 21 in a direction opposite to the direction in which the end portion 23a extends. Similarly, the extension 51 being of a generally U-shaped configuration having a pair of opposite arms 51a and 51b connected together by a bridging portion 51c has the arm 51a inserted in and secured to the first strip electrode 23, and also has the arm 51b engaged to the lower surface of the block 21 while the bridging portion 51c extends along the opposite end face of the block 21 in a direction opposite to the direction in which the end portion 23b extends.

The auxiliary electrode member 52 is of a generally U-shaped configuration having a pair of opposite arms 52a and 52b connected together by a bridging portion 52c. This auxiliary electrode member 52 encircles the bottom of the block 21 with the bridging portion 52c held in contact with the lower surface of the block 21 and with the arms 52a and 52b connected respectively to the legs 28a and 28b of the second strip electrode 28 thereby avoiding any possible separation of the second strip electrode from the block 21 and, hence, any possible floating of the capacitors 24 and 25 relative to the block 21.

The noise reduction filter 40 according to the embodiment shown in and described with reference to FIGS. 13 to 16 functions in a manner similar to the filters 20 and 30 shown respectively in FIGS. 4 to 8 and FIGS. 10 to 12. However, in view of the additional employment of the extensions 50 and 51 and the auxiliary electrode member 52, not only can the capacitors 24 and 25 be firmly held against the block 21 with no possibility of the capacitors floating from the upper surface of the block 21, but also the filter 40 can readily be mounted on a printed circuit board with no need to employ extra wirings such as required in the filter according to any of the foregoing embodiments.

Figure 10:
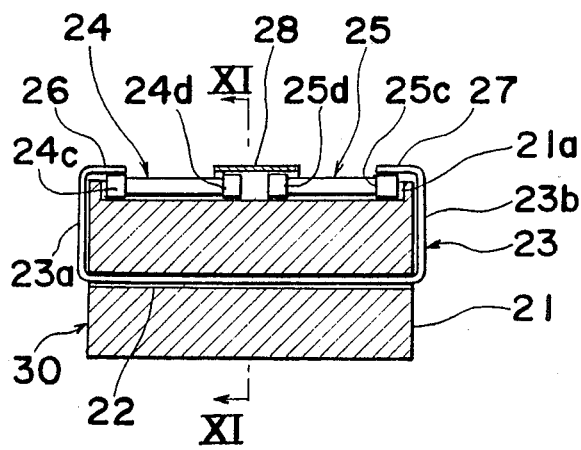
FIG. 10 is a side sectional view of the filter according to another preferred embodiment of the present invention.
Figure 11:
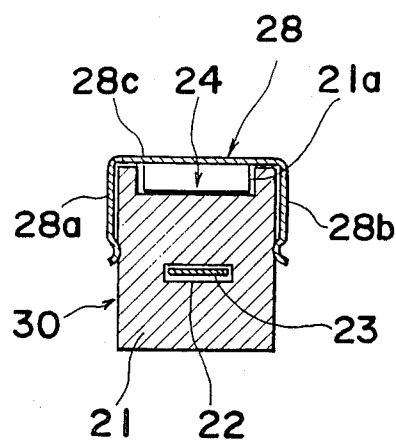
FIG. 11 is a cross-sectional view taken along the line XI—XI shown in FIG. 10.

It is to be noted that the concept of the present invention shown in FIGS. 13 to 16 can be equally applicable to the embodiment shown in FIGS. 10 to 12. In other words, the block 21 shown in FIGS. 13 and 14 may have the recess formed in the upper surface thereof for accommodating the capacitors 24 and 25.

Figure 17:
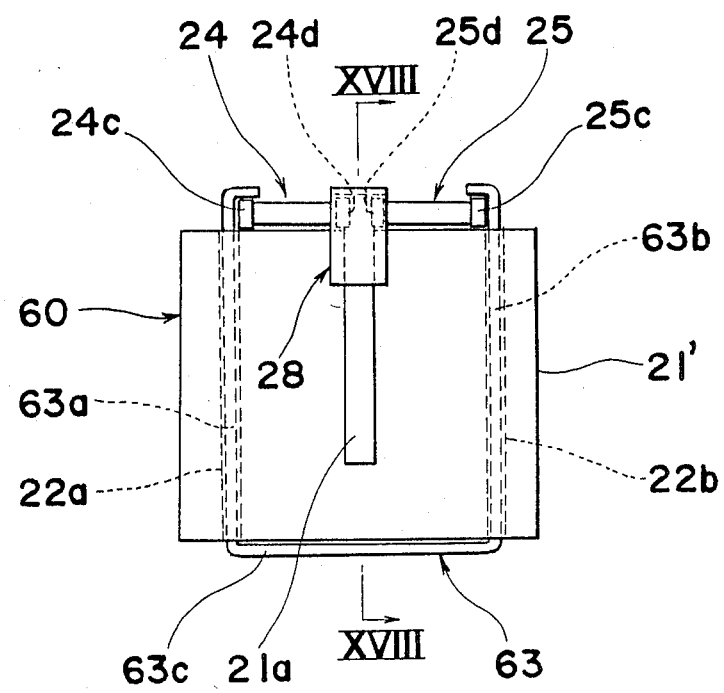
FIG. 17 is a front elevational view of the filter according to a still further preferred embodiment of the present invention.
Figure 18:
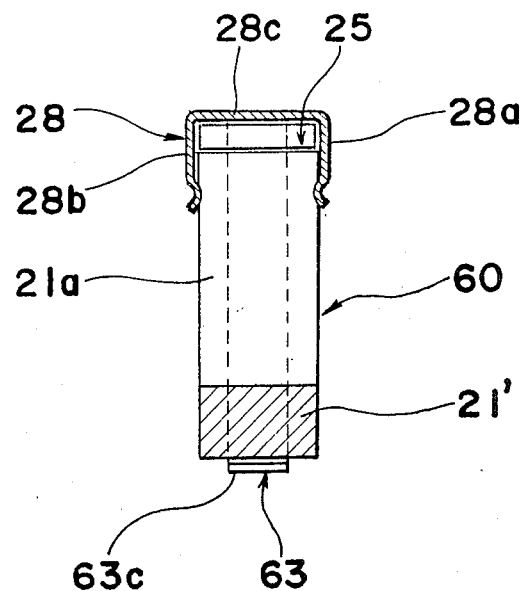
FIG. 18 is a cross-sectional view taken along the line XVIII—XVIII shown in FIG. 17.

In the embodiment shown in FIGS. 17 and 18, the block 21' is shown to have a slit 21a defined therein so as to extend from the upper surface thereof to a position spaced a distance inwardly from the lower surface thereof, thereby allowing the block 21' to assume a generally U-shaped configuration as best shown in FIG. 17. The block 21' also has a pair of parallel through-holes 22a and 22b defined therein on respective sides of the slit 21a so as to extend completely from the upper surface to the lower surface of the block 21' in parallel relation to the longitudinal sense of the slit 21a.

The first strip electrode member shown by 63 is of a generally U-shaped configuration having a pair of arms 63a and 63b connected together by means of a bridging portion 63c, which arms 63a and 63b are inserted through the through-holes 22a and 22b, respectively, while the bridging portion 63c extends in contact with and along the lower surface of the block 21'. The respective free ends of the arms 63a and 63b are bent inwardly of the block 21' so as to extend in a direction close towards each other and are connected by soldering or any suitable means to the terminal electrodes 24c and 25c of the respective capacitors 24 and 25 so as to draw the terminal electrodes 24c and 25c close to the upper surface of the block 21'.

In this embodiment shown in and described with reference to FIGS. 17 and 18, the noise reduction filter 60 functions in a manner similar to the filter according to any one of the foregoing embodiments. Specifically, because of the provision of the slit 21a, the magnetic fields produced respectively in the block 21' around the arms 63a and 63b when the electric current is applied to the first strip electrode 63 will not interfere with each other. In addition, the embodiment shown in FIGS. 17 and 18 is advantageous in that, since the first strip electrode 63 extends a relatively great distance through the magnetizable body for a given size of the magnetized body, the effective length of the magnetizable body along which the electric field is produced can be increased and, therefore, a relatively high impedance can be obtained.

It is to be noted that, in the embodiment shown in FIGS. 17 and 18, a recess may be formed in the upper surface of the block 21' for accommodating the capacitors 24 and 25 as is the case with the embodiment shown in FIGS. 10 to 12.

From the foregoing description, it has now become clear that, since the capacitors are carried by and integrated together with the magnetizable block through the first strip electrode, passing through the magnetizable body, and the second strip electrode retained on the magnetizable block at a suitable location, the noise reduction filter can be fabricated into a chip-like configuration suited for use on a printed circuit board. Thus, it is clear that the filter according to the present invention can be readily manufactured in a compact size with the minimized number of the component parts and can contribute to the low cost fabrication of a high density electronic component.

Although the present invention has been fully described in connection with the preferred embodiments thereof with reference to the accompanying drawings, it is to be noted that numerous changes and modifications are apparent to those skilled in the art. By way of example, the filter according to any one of the embodiments of the present invention may, after having been completely fabricated, be encapsulated with a resin coating in which case either the electrode portions or the lead wirings should be exposed to the outside for requisite external electrical connection with circuit elements.

Moreover, although in each of the embodiments the capacitors have been described and shown as spacedly mounted on the magnetizable block, they may be positioned in end-to-end abutting relation to each other with the electrodes 24d and 25d held in contact with each other or connected together.

Such changes and modifications are to be understood as included within the scope of the present invention as defined by the appended claims, unless they depart therefrom.

What is claimed is:

1. A noise reduction filter which comprises a block of magnetizable material, first and second capacitors each having first and second terminal electrodes opposite to each other, said first and second capacitors being mounted on one surface of the block with the second terminal electrodes of the respective first and second capacitors confronting with each other, a first electrode member in the form of a strip partially extending through the block with its opposite end portions being connected to the first terminal electrodes of the respective first and second capacitors, and a second electrode member in the form of a strip mounted on the block with a portion thereof electrically connecting the second terminal electrodes of the respective first and second capacitors together, wherein said block has a single through-hole defined therein, a substantially intermediate portion of said first electrode member between said opposite end portions thereof extending through said through-hole.

2. A filter as claimed in claim 1, wherein said one surface of the block is inwardly recessed for accommodating therein the first and second capacitors.

3. A filter as claimed in claim 1, wherein the block has first and second through-holes defined therein in parallel relation to each other and also a slit defined therein so as to extend intermediately between the first and second through-holes, said first electrode member being shaped to represent a generally U-shaped configuration extending through the first through-hole, then exteriorly of the block at a position opposite to the capacitors and finally through the second through-hole.

4. A noise reduction filter which comprises a block of magnetizable material, first and second capacitors each having first and second terminal electrodes opposite to each other, said first and second capacitors being mounted on one surface of the block with the second terminal electrodes of the respective first and second capacitors confronting with each other, a first electrode member partially extending through the block with its opposite end portions being connected to the first terminal electrodes of the respective first and second capacitors, and a second electrode member mounted on the block with a portion thereof electrically connecting the second terminal electrodes of the respective first and second capacitors together, said one surface of said block being inwardly recessed for accommodating therein said first and second capacitors.

5. A noise reduction filter which comprises a block of magnetizable material, first and second capacitors each having first and second terminal electrodes opposite to each other, said first and second capacitors being mounted on one surface of the block with the second terminal electrodes of the respective first and second capacitors confronting with each other, a first electrode member partially extending through the block with its opposite end portions being connected to the first terminal electrodes of the respective first and second capacitors, and a second electrode member mounted on the block with a portion thereof electrically connecting the second terminal electrodes of the respective first and second capacitors together, said block having first and second through-holes defined therein parallel relation to each other and also a slit defined therein so as to extend intermediately between said first and second through-holes, said first electrode member being shaped to represent a generally U-shaped configuration extending through said first through-hole, then exteriorly of said block at a position opposite to the capacitors and finally through said second through-hole.

* * * * *